(12) United States Patent
Mathur et al.

(10) Patent No.: US 12,068,025 B2
(45) Date of Patent: Aug. 20, 2024

(54) POWER-UP HEADER CIRCUITRY FOR MULTI-BANK MEMORY

(71) Applicant: Arm Limited, Cambridge (GB)

(72) Inventors: Rahul Mathur, Austin, TX (US); Edward Martin McCombs, Jr., Austin, TX (US); Hsin-Yu Chen, Austin, TX (US)

(73) Assignee: Arm Limited, Cambridge (GB)

( * ) Notice: Subject to any disclaimer, the term of this patent is extended or adjusted under 35 U.S.C. 154(b) by 119 days.

(21) Appl. No.: 17/856,928

(22) Filed: Jul. 1, 2022

(65) Prior Publication Data

US 2024/0005983 A1  Jan. 4, 2024

(51) Int. Cl.
*G11C 11/00* (2006.01)
*G11C 11/412* (2006.01)
*G11C 11/418* (2006.01)

(52) U.S. Cl.
CPC .......... *G11C 11/418* (2013.01); *G11C 11/412* (2013.01)

(58) Field of Classification Search
CPC ... G11C 11/419; G11C 11/412; G11C 11/418; G11C 7/12; G11C 8/16; G11C 5/148; G11C 8/08; G11C 8/10; G11C 16/10; G11C 16/28; G11C 5/147; G11C 7/08; G11C 7/14; G11C 11/4087; G11C 11/413; G11C 11/417; G11C 5/145; G11C 7/18; G11C 8/12; G11C 5/14; G11C 7/02; G06F 15/781

USPC ..... 365/230.06, 154, 226, 230.02, 203, 227, 365/189.16, 230.01, 156, 189.011, 365/189.09, 189.15, 191
See application file for complete search history.

(56) References Cited

U.S. PATENT DOCUMENTS

| | | |
|---|---|---|
| 9,620,200 B1 | 4/2017 | Mangal et al. |
| 10,497,414 B1 | 12/2019 | Mathur et al. |
| 2023/0080591 A1* | 3/2023 | Kumar .................. G11C 11/412 365/154 |

OTHER PUBLICATIONS

Jafari, et al.; Analysis of Power Gating in Different Hierarchical Levels of 2MB Cache, Considering Variation; International Journal of Electronics; vol. 102, Issue 9; pp. 1594-1608; 2015. http://dx.doi.org/10.1080/00207217.2014.984640.

(Continued)

*Primary Examiner* — Thong Q Le
(74) *Attorney, Agent, or Firm* — Pramudji Law Group PLLC; Ari Pramudji

(57) ABSTRACT

Various implementations described herein are directed to a device having memory with banks of bitcells with each bank having a bitcell array. The device may have header circuitry that powers-up a selected bank and powers-down unselected banks during a wake-up mode of operation. In some instances, only the selected bank of the memory is powered-up with the header circuitry during the wake-up mode of operation.

19 Claims, 5 Drawing Sheets

(56) References Cited

OTHER PUBLICATIONS

Pilo, et al; A 64Mb SRAM in 22nm SOI Technology Featuring Fine-Granularity Power Gating and Low-Energy Power-Supply-Partition Techniques for 37% Leakage Reduction; 2013 IEEE International Solid-State Circuits Conference Digest of Technical Papers ISSCC 2013; Session 18; Feb. 2013.

Kim, et al.; Circuit and Microarchitectural Techniques for Reducing Cache Leakage Power; IEEE Transactions on Very Large Scale Integration (VLSI) Systems; vol. 12, No. 2; pp. 167-184; Feb. 2004.

Flautner, et al.; Drowsy Caches: Simple Techniques for Reducing Leakage Power; Proceedings of the 29th Annual International Symposium on Computer Architecture (ISCA '02); IEEE; May 2002.

* cited by examiner

200

Multi-Bank Memory Architecture 204

| Core Hdr (vddc1A_fbl) | WL Hdr (vddc_wl1_fbl) | Core Hdr (vddc1B_fbl) |
|---|---|---|
| Bank 1C (FBL) | WLDRV1 210B | Bank 1D (FBL) |
| FBL Transition 224C | | FBL Transition 224D |
| Bank 1A (BL) | | Bank 1B (BL) |
| Core Hdr (vddc1A_bl) | WL Hdr (vddc_wl1_bl) | Core Hdr (vddc1B_bl) |
| COLM 212A | CTRL 214 | COLM 212B |
| Core Hdr (vddc0A_bl) | WL Hdr (vddc_wl0_bl) | Core Hdr (vddc0B_bl) |
| Bank 0A (BL) | WLDRV0 210A | Bank 0B (BL) |
| FBL Transition 224A | | FBL Transition 224B |
| Bank 0C (FBL) | | Bank 0D (FBL) |
| Core Hdr (vddc0A_fbl) | WL Hdr (vddc_wl0_fbl) | Core Hdr (vddc0B_fbl) |
| IO 218 | | |

FIG. 2

POWER-UP HEADER CIRCUITRY FOR MULTI-BANK MEMORY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In high performance Systems-on-Chip (SoC), leakage power consumption has become comparable to the dynamic component, and this leakage relevance increases as technology scales higher. With technology scaling, the supply voltage is scaled down to reduce dynamic power, and transistor threshold voltage (Vth) is commensurately scaled down to maintain drive current and improve transistor performance. The reduction in Vth leads to a significant increase in the subthreshold leakage current, and low static power (leakage power) is an important metric in good system cache design. Circuit techniques such as power-gating are used to reduce static power (leakage power) by powering down circuit blocks when inactive. However, current memory designs for L1/L2 caches do not support efficient power-gating schemes that can improve leakage in system cache. Thus, traditional layout techniques of some bitcell architectures can be power inefficient, and as such, there exists a need to improve the traditional layout techniques of system cache memory that allows for efficient use of power so as to improve performance.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 2 illustrates a diagram of multi-bank memory architecture in accordance with various implementations described herein.

DETAILED DESCRIPTION

Various implementations described herein refer to providing power-up header schemes and techniques for multi-bank memory applications in physical designs for deep leakage savings. The various schemes and techniques described herein may provide for a novel power-up header technique for use in fine grain automatic power management of static random access memory (SRAM) arrays for system cache memory in multi-bank memory applications. In some applications, the fine grain automatic power management scheme for use in system cache memories may be used to power-up memory cores and wordline drivers before memory access when enabled using a retention signal (RET). In some applications, the fine grain automatic power management scheme may be used to power-up only a selected bank using bank address (BA) information (e.g., A[n:n−1] and/or A[n−2:0]). Moreover, in some applications, the fine grain automatic power management scheme may be used to allow fine-grained power-gating control for different banks and non-flexible/flexible bitlines (BL, FBL) memory blocks, to allow fine-grained power-gating control for different wordline driver blocks, and to automatically power-down unselected banks when bank address (BA) changes state for another access.

Various implementations of providing power-up header schemes for multi-bank memory applications will be described herein with reference to FIGS. 1-5.

Figure 1:
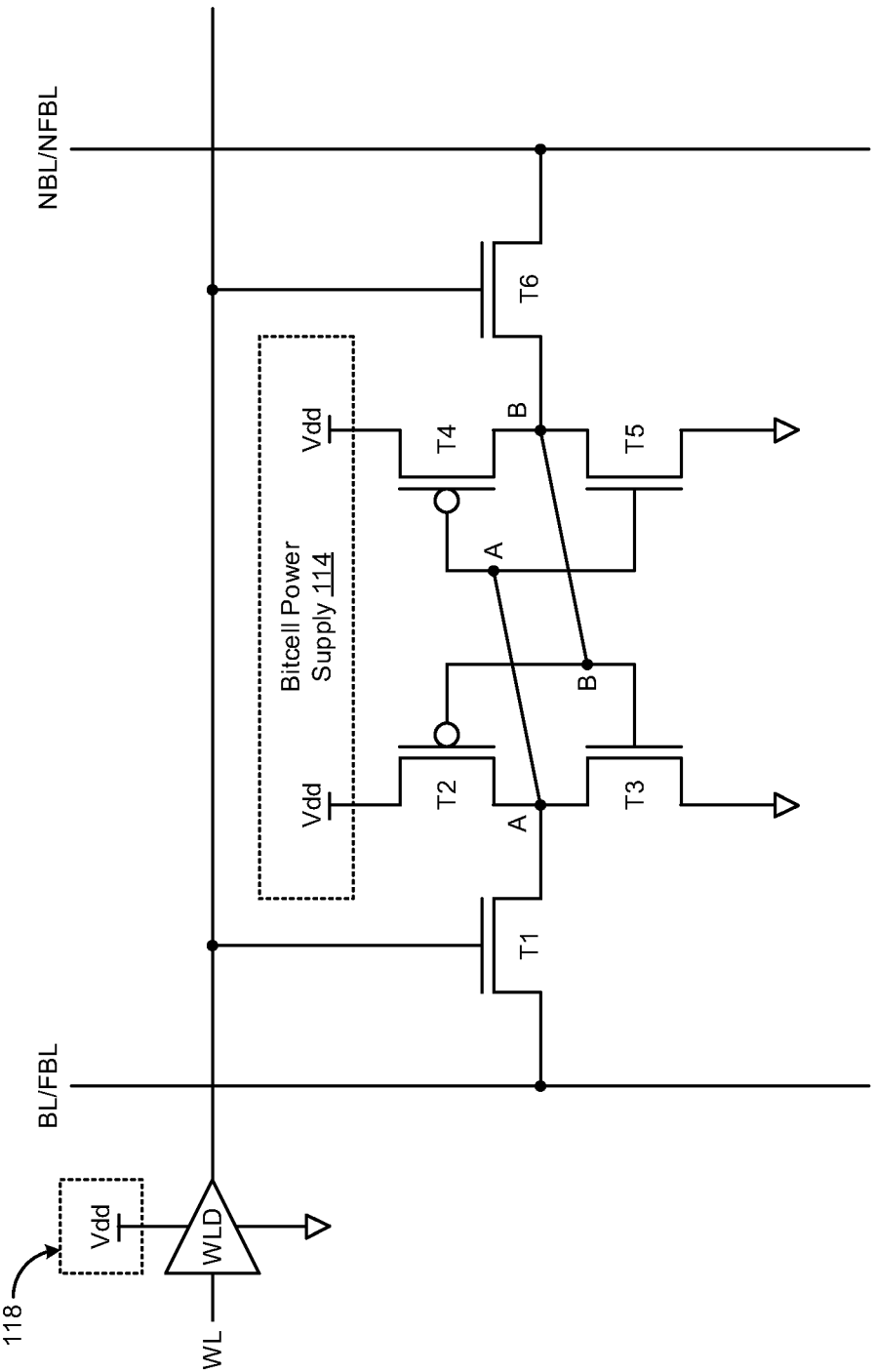
FIG. 1 illustrates a diagram of bitcell architecture in accordance with various implementations described herein.

FIG. 1 illustrates a diagram 100 of bitcell architecture 104 in accordance with various implementations described herein.

In some implementations, the bitcell architecture 104 may be implemented as a system or a device having various integrated circuit (IC) components that are arranged and coupled together as an assemblage or combination of parts that provide for physical circuit designs and various related structures. In some instances, a method of designing, providing and building the bitcell architecture 104 as an integrated system or device may involve use of various IC circuit components described herein so as to thereby implement fabrication schemes and techniques associated therewith. Further, the bitcell architecture 104 may be integrated with computing circuitry and related components on a single chip, and the bitcell architecture 104 may be implemented in various embedded systems for automotive, electronic, mobile, server and Internet-of-things (IoT) applications.

As shown in FIG. 1, the bitcell architecture 104 may include a multi-transistor bitcell structure, such as, e.g., a six-transistor (6T) static random access memory (SRAM) bitcell structure. In some instances, the six-transistors (6T) may include multiple (e.g., 4) N-type metal-oxide-semiconductor (NMOS) transistors along with multiple (e.g., 2) P-type MOS (PMOS) transistors. Passgate transistor (T1) may be coupled between a first bitline (BL/FBL) and node (A), and passgate transistor (T6) may be coupled between a second bitline (NBL/NFBL) and node (B) that is complementary to the first bitline (BL/FBL). Also, the wordline (WL) may be coupled to gates of transistors (T1, T6) to access data stored in a latch formed by transistors (T2, T3, T4, T5) via the wordline (WL) and bitlines (BL/FBL, NBL/NFBL). Also, transistors (T2, T3) may be coupled in series between voltage supply (Vdd) and ground (Gnd or Vss), wherein node (A) is formed between pull-up transistor (T2) and pull-down transistor (T3). Transistors (T4, T5) may be coupled in series between voltage supply (Vdd) and ground (Gnd or Vss), wherein node (B) is formed between pull-up transistor (T4) and pull-down transistor (T5). Also, transistors (T2, T3) may be cross-coupled with transistors (T4, T5) such that node (A) is coupled to the gates of transistors (T4, T5) and such that node (B) is coupled to the gates of transistors (T2, T3).

In some implementations, the bitcell architecture 104 has a bitcell power supply 114 that is coupled to the Vdd input of transistors (T2, T4). As shown in FIG. 1, transistor (T2) may be coupled between voltage supply (Vdd) and node (A), and transistor (T4) may be coupled between voltage supply (Vdd) and node (B). Also, the bitcell architecture 104 has a wordline driver (WLD) that is coupled to the gates of passgate transistors (T1, T6) via the wordline (WL). Also, the bitcell architecture 104 has a WLD power supply 118 that is coupled to the Vdd input (or power supply connection) of the wordline driver (WLD), and the wordline driver (WLD) is coupled between Vdd and ground (Vss, Gnd).

In some implementations, the bitlines include non-flexible bitlines (BL/NBL) and flexible bitlines (FBL/NFBL). In various instances, transistors (T2, T4) may refer to P-type field-effect transistors (PFET), and transistors (T1, T3, T5, T6) refer to N-type FET (NFET) transistors. However, various other configurations may be used to achieve similar results, behavior and/or characteristics.

The bitcell architecture 104 may be implemented with one or more core arrays of bitcells or memory cells, wherein each bitcell may be configured to store at least one data-bit value (e.g., data value related to a logical '0' or '1'). The one or more core arrays may include any number of bitcells arranged in various configurations, such as, e.g., two-dimensional (2D) memory arrays having any number of columns and any number of rows of multiple bitcells, which may be arranged in a 2D grid pattern for read and write memory access operations. However, even though SRAM bitcell structure is shown and described in FIG. 1, various other types of bitcell structures may be used to achieve similar results of the various bitline precharging schemes and techniques described herein.

FIG. 2 illustrates a schematic diagram 200 of multi-bank memory architecture 204 in accordance with various implementations described herein. In some applications, the multi-bank memory architecture 204 includes power-up header circuitry for multi-bank memory with core header circuitry (Core Hdr) and worldline header circuitry (WL Hdr).

In some implementations, the multi-bank memory architecture 204 in FIG. 2 may be implemented as a system or a device having integrated circuit (IC) components that are arranged and coupled together as an assemblage or some combination of parts that provide for physical circuit designs and various related structures. In some instances, a method of designing, providing and building the multi-bank memory architecture 204 as an integrated system or device may involve use of various circuit components described herein so as to thereby implement power-up header schemes and techniques associated therewith. Also, the multi-bank memory architecture 204 may be integrated with various computing circuitry and related components on a single chip, and the multi-bank memory architecture 204 may be implemented in embedded systems for automotive, electronic, mobile, server and IoT applications, including remote sensor nodes.

As shown in FIG. 2, the multi-bank memory architecture 204 includes multiple memory banks (Bank0, Bank1) with each bank having multiple segments, wherein Bank0 includes Bank0A, Bank0B, Bank 0C, Bank0D, and wherein Bank1 has Bank 1A, Bank1B, Bank 1C, Bank1D. In some implementations, bank segments (Bank0A, Bank0B, Bank1A, Bank1B) may use bitlines (BL), and bank segments (Bank0C, Bank0D, Bank1C, Bank1 D) may use flexible bitlines (FBL) with FBL transition circuitry coupled between the BL banks and the FBL banks. For instance, FBL transition circuitry 224A may be coupled between BL Bank0A and FBL Bank0C, and FBL transition circuitry 224B may be coupled between BL Bank0B and FBL Bank0D. Also, in some instances, FBL transition circuitry 224C may be coupled between BL Bank1A and FBL Bank1C, and FBL transition circuitry 224D may be coupled between BL Bank1 B and FBL Bank1 D. In some applications, each memory bank has an array of bitcells that may include an array of SRAM bitcells. However, various other memory configurations may be used to achieve similar results.

In some implementations, the multi-bank memory architecture 204 may include various other support circuitry, such as, e.g., wordline driver circuitry 210A, 210B, column multiplexer circuitry 212A, 212B, control circuitry 214 and input-output (10) circuitry 218, which are coupled to memory banks (Bank0, Bank1) for memory access operations via columns and rows. For instance, in a first column, a first column multiplexer (COLM) 212A may be coupled to memory segments (Bank0A, Bank0C) and FBL transition 224A and to memory segments (Bank1A, Bank1C) and FBL transition 224C. In a second column, a second column multiplexer (COLM) 212B may be coupled to memory segments (Bank0B, Bank0D) and FBL transition 224B and to memory segments (Bank1B, Bank1D) and FBL transition 224D. In a first row, a first wordline driver (WLDRV) 210B may be coupled to memory segments (Bank0A, Bank0B, Bank0C, Bank0D) and FBL transitions 224A, 224B. In a second row, a second wordline driver (WLDRV) 210B may be coupled to memory segments (Bank1A, Bank1B, Bank1C, Bank1 D) and FBL transitions 224C, 224D. Also, in some instances, the control circuitry (CTRL) 214 may be coupled to each bank (Bank0, Bank1) and to their corresponding column multiplexers (COLM) 212A, 212B and wordline drivers (WLDRV) 210A, 210B. Also, the input-output circuitry (IO) 218 may be coupled to each bank (Bank0, Bank1) and to their corresponding column multiplexers (COLM) 212A, 212B and wordline drivers (WL-DRV) 210A, 210B.

In some implementations, the multi-bank memory architecture 204 may include various additional support circuitry, such as, e.g., core header circuitry (Core Hdr) and/or worldline header circuitry (WL Hdr). As shown in FIG. 2, the first bank (Bank 0) includes multiple segments Bank 0A and Bank 0B that are coupled to bitlines (BL), and also, the first bank (Bank 0) includes multiple segments Bank 0C and Bank 0D that are coupled to flexible bitlines (FBL). In addition, the second bank (Bank 1) includes multiple segments Bank 1A and Bank 1B that are coupled to bitlines (BL), and also, the second bank (Bank 1) includes multiple segments Bank 1C and Bank 1D that are coupled to flexible bitlines (FBL). Generally, the bitlines (BL) may be referred to as non-flexible bitlines.

The core header circuitry (Core Hdr) may include Core Hdr (vddc0A_bl) that is coupled to bitline bank 0A (BL), and the core header circuitry (Core Hdr) may include Core Hdr (vddc0B_bl) that is coupled to bitline bank 0A (BL). The wordline header circuitry (WL Hdr) may include WL Hdr (vddc_wl0_bl) that is coupled to Core Hdr (vddc0A_bl) and Core Hdr (vddc0B_bl). The core header circuitry (Core Hdr) may include Core Hdr (vddc0C_fbl) that is coupled to flexible bitline bank 0C (FBL), and the core header circuitry (Core Hdr) may include Core Hdr (vddc0D_fbl) that is coupled to flexible bitline bank 0D (FBL). Also, the wordline header circuitry (WL Hdr) may include WL Hdr (vddc_wl0_fbl) that is coupled to Core Hdr (vddc0C_fbl) and Core Hdr (vddc0D_fbl).

The core header circuitry (Core Hdr) may include Core Hdr (vddc1A_bl) that is coupled to bitline bank 1A (BL), and the core header circuitry (Core Hdr) may include Core Hdr (vddc1B_bl) that is coupled to bitline bank 1A (BL). The wordline header circuitry (WL Hdr) may include WL Hdr (vddc_wl1_bl) that is coupled to Core Hdr (vddc1A_bl) and Core Hdr (vddc1 B_bl). The core header circuitry (Core Hdr) may include Core Hdr (vddc1C_fbl) that is coupled to flexible bitline bank 1C (FBL), and the core header circuitry (Core Hdr) may include Core Hdr (vddc1D_fbl) that is coupled to flexible bitline bank 1D (FBL). Also, the wordline header circuitry (WL Hdr) may include WL Hdr (vddc_wl1_fbl) that is coupled to Core Hdr (vddc1C_fbl) and Core Hdr (vddc1D_fbl).

In some implementations, the multi-bank memory architecture 204 as shown in FIG. 2 represents the placement of power-gates in memory macro. Memory periphery may be supplied with power from a gated supply (vddp), as shown in FIG. 3, wherein multiple separate headers (e.g., Core Hdr and WL Hdr) are also used to supply power to SRAM bitcell banks (vddc) and wordline (WL) driver blocks (vddc_wl).

In some implementations, the multi-bank memory architecture 204 has memory with banks of bitcells such that each bank has a bitcell array. Also, the multi-bank memory architecture 204 has header circuitry (Hdr) that powers-up a selected bank and powers-down unselected banks during a wake-up mode of operation, wherein only the selected bank of memory is powered-up with the header circuitry (Hdr) during the wake-up mode of operation. As such, the header circuitry (Hdr) only powers-up the selected bank during the wake-up mode of operation, and also, the header circuitry (Hdr) only powers-down the unselected banks during the wake-up mode of operation.

In some implementations, the multi-bank memory architecture 204 has memory with banks of bitcells with each bank having a bitcell array. Also, the multi-bank memory architecture 204 has header circuitry with a multiplexer that selects power-gate transistors coupled to the banks of bitcells during a wake-up mode of operation. The header circuitry (Hdr) powers-up a selected bank with at least one power-gate transistor during the wake-up mode of operation, and the header circuitry (Hdr) powers-down unselected banks with one or more other power-gate transistors during the wake-up mode of operation. Further details regarding the header circuitry (Hdr), the multiplexer and the power-gate transistors are described in greater detail herein below in reference to FIG. 3.

Figure 3:
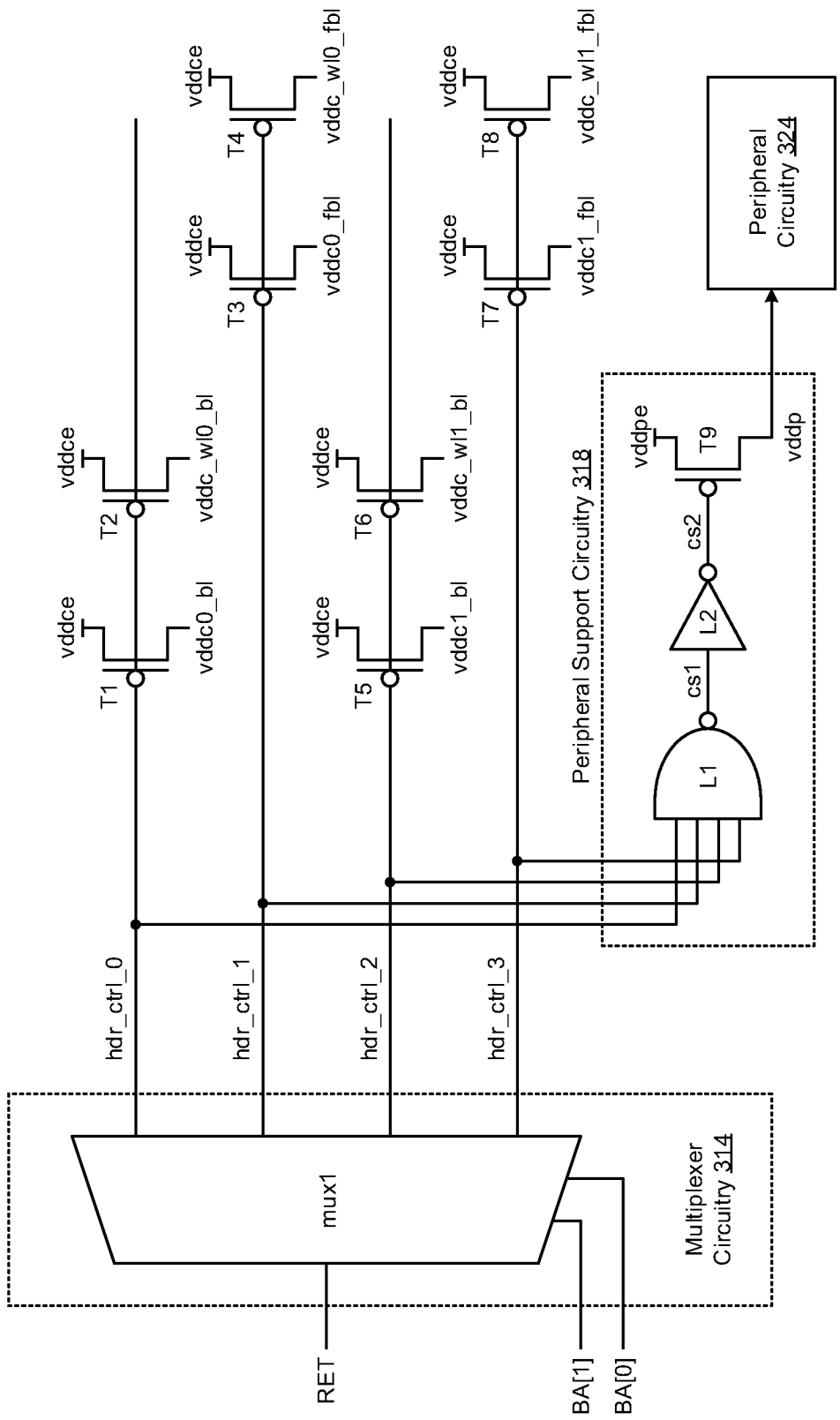
FIG. 3 illustrates a diagram of power-up header circuitry in accordance with various implementations described herein.

FIG. 3 illustrates a schematic diagram 300 of power-up header circuitry 304 in accordance with various implementations described herein. In various applications, the power-up header circuitry 304 may be configured to selectively wake-up memory banks and wordline headers from retention upon memory access.

In various implementations, the power-up header circuitry 304 in FIG. 3 may be implemented as a system or device having integrated circuit (IC) components that are arranged and coupled together as an assemblage or combination of parts that provide for physical circuit designs and various related structures. In various instances, a method of designing, providing and/or building the power-up header circuitry 304 as an integrated system or device may involve use of various circuit components described herein so as to implement power-up header schemes and techniques associated therewith. Moreover, the power-up header circuitry 304 may be integrated with various computing circuitry and related components on a single chip, and also, the power-up header circuitry 304 may be implemented in various embedded systems for automotive, electronic, mobile, server and IoT applications, including remote sensor nodes.

As shown in FIG. 3, the power-up header circuitry 304 may have power-gate transistors (T1, T2, T3, T4, T5, T6, T7, T8) for each bank that are activated by a header control signal (hdr_ctrl_0, hdr_ctrl_1, hdr_ctrl_2, hdr_ctrl_3) so as to selectively power-up a selected bank during a wake-up mode of operation. Also, the power-gate transistor (T1, T2, T3, T4, T5, T6, T7, T8) for the selected bank is coupled between a core supply voltage (vddce) and the selected bank so as to power-up the selected bank during the wake-up mode of operation and to allow transfer of the core supply voltage (vddce) to the bitcells of the selected bank during the wake-up mode of operation. In some instances, the core supply voltage (vddce) may be referred to as an external supply voltage.

In some implementations, the power-gate transistors (T1, T2, T3, T4, T5, T6, T7, T8) for each unselected bank are deactivated by the header control signal (hdr_ctrl_0, hdr_ctrl_1, hdr_ctrl_2, hdr_ctrl_3) so as to selectively power-down the unselected banks during the wake-up mode of operation. Also, the power-gate transistors (T1, T2, T3, T4, T5, T6, T7, T8) for the unselected banks may be coupled between the core supply voltage (vddce) and the unselected banks so as to power-down the unselected banks during the wake-up mode of operation and prevent transfer of the core supply voltage (vddce) to the bitcells of the unselected banks during the wake-up mode of operation.

In various implementations, the power-up header circuitry 304 has a multiplexer (mux1) that selects/deselects the power-gate transistors (T1, T2, T3, T4, T5, T6, T7, T8) coupled to the banks of bitcells via corresponding bitcell power supplies 114 of the bitcells and WLD power supplies 118 of the wordlines drivers (WLD) of the bitcells, e.g., as shown in FIG. 1, respectively. The multiplexer (mux1) powers-up selected banks by activating the power-gate transistors (T1, T2, T3, T4, T5, T6, T7, T8) that are coupled to the selected banks during the wake-up mode of operation, and also, the multiplexer (mux1) powers-down the unselected banks by deactivating the power-gate transistors (T1, T2, T3, T4, T5, T6, T7, T8) that are coupled to the unselected banks during the wake-up mode of operation. Also, the bitlines may refer to non-flexible bitlines (BL/NBL) and flexible bitlines (FBL/NFBL), and the multiplexer (mux1) may select at least one of the non-flexible bitlines (BL/NBL) and flexible bitlines (FBL/NFBL) for each bank with the power-gate transistors (T1, T2, T3, T4, T5, T6, T7, T8) during the wake-up mode of operation.

In some implementations, the multiplexer (mux1) selects/deselects the power-gate transistors (T1, T2, T3, T4, T5, T6, T7, T8) that are coupled to the banks of bitcells via the bitcell power supplies 114 and WLD power supplies (118). The multiplexer (mux1) powers-up selected banks by activating the power-gate transistors (T1, T2, T3, T4, T5, T6, T7, T8) that are coupled to the bitcell power supplies 114 and WLD power supplies (118) for the selected banks. The multiplexer (mux1) powers-down unselected banks by deactivating the power-gate transistors (BL/NBL, FBL/NFBL) and the wordlines (WL) that are coupled to the bitcell power supplies 114 and WLD power supplies (118) for the unselected banks.

In some implementations, the multiplexer (mux1) generates the header control signal (hdr_ctrl_0, hdr_ctrl_1, hdr_ctrl_2, hdr_ctrl_3) so as to select/deselect the power-gate transistors (T1, T2, T3, T4, T5, T6, T7, T8) based on one or more input signals (RET, BA[0], BA[1]) including retention signal (RET), first bank select signal BA[0], and second bank select signal [BA[1]. Also, the multiplexer (mux1) may be configured to output the header control signal (hdr_ctrl_0, hdr_ctrl_1, hdr_ctrl_2, hdr_ctrl_3) to gates of the power-gate transistors (T1, T2, T3, T4, T5, T6, T7, T8) for selective activation and deactivation of the power-gate transistors (T1, T2, T3, T4, T5, T6, T7, T8) so as to thereby power-up the selected bank and power-down the unselected banks during the wake-up mode of operation.

In various implementations, as shown in FIG. 3, the power-up header circuitry 304 may have multiplexer circuitry 314 with the multiplexer (mux1) that receives the input signals (RET, BA[0], BA[1]) and provides header control signals (hdr_ctrl_0, hdr_ctrl_1, hdr_ctrl_2, hdr_ctrl_3) as output signals to the power-gate transistors (T1, T2, T3, T4, T5, T6, T7, T8) based on various combinations of the input signals (RET, BA[0], BA[1]). In some applications, the multiplexer (mux1) may provide the header control signal (hdr_ctrl_0) to gates of power-gate transistors (T1, T2) for activation and/or deactivation thereof so as to supply or prevent supply of the core voltage (vddce) to the first BL bank segments (Bank 0A, Bank 0B). Also, multiplexer (mux1) may provide header control signal (hdr_ctrl_1) to gates of power-gate transistors (T3, T4) for activation and/or deactivation thereof so as to supply or prevent supply of the core voltage (vddce) to first FBL bank segments (Bank 0C, Bank 0D). Also, the multiplexer (mux1) may provide the header control signal (hdr_ctrl_2) to gates of power-gate transistors (T5, T6) for activation and/or deactivation thereof so as to supply or prevent supply of the core voltage (vddce) to the second BL bank segments (Bank 1A, Bank 1 B). Also, the multiplexer (mux1) may provide the header control signal (hdr_ctrl_3) to gates of power-gate transistors (T7, T8) for activation and/or deactivation thereof so as to supply or prevent supply of the core voltage (vddce) to the second FBL bank segments (Bank 1C, Bank 1D).

In various implementations, the power-up header circuitry 304 may provide for a combination of core header circuitry (Core Hdr) and wordline header circuitry (WL Hdr), as shown in FIG. 2. Also, the first bank (Bank 0) includes BL Bank 0A and BL Bank 0B, and the first bank (Bank 0) includes FBL Bank 0C and FBL Bank 0D. Further, the second bank (Bank 1) includes BL Bank 1A and BL Bank 1B, and also, the second bank (Bank 1) includes FBL Bank 1C and FBL Bank 1D.

When activated, power-gate transistors (T1, T2) supply core voltage (vddce) to bitcell power supplies 114 (vddc0_bl, including vddc0A_bl and vddc0B_bl) and to WLD power supplies (118) (vddc_wl0_bl) of first BL bank (Bank 0, including Bank 0A and Bank 0B). When deactivated, power-gate transistors (T1, T2) prevent supply of core voltage (vddce) to bitcell power supplies 114 (vddc0_bl, including vddc0A_bl and vddc0B_bl) and to WLD power supplies (118) (vddc_wl0_bl) of first BL bank (Bank 0, including Bank 0A and Bank 0B). In some instances, the core supply voltage (vddce) may be referred to as an external supply voltage, and also, the other voltages (vddc*) may be referred to as internal supply voltages.

When activated, power-gate transistors (T3, T4) supply core voltage (vddce) to bitcell power supplies 114 (vddc0_fbl, including vddc0C_fbl and vddc0D_fbl) and to WLD power supplies (118) (vddc_wl0_fbl) of first FBL bank (Bank 0, including Bank 0C and Bank 0D). When deactivated, power-gate transistors (T3, T4) prevent supply of core voltage (vddce) to bitcell power supplies 114 (vddc0_fbl, including vddc0C_fbl and vddc0D_fbl) and to WLD power supplies (118) (vddc_wl0_fbl) of first FBL bank (Bank 0, including Bank 0C and Bank 0D).

When activated, power-gate transistors (T5, T6) supply core voltage (vddce) to bitcell power supplies 114 (vddc1_bl, including vddc1A_bl and vddc1B_bl) and to wordline (vddc_wl1_bl) of second BL bank (Bank 1, including Bank 1A and Bank 1B). When deactivated, power-gate transistors (T5, T6) prevent supply of core voltage (vddce) to bitcell power supplies 114 (vddc1_bl, including vddc1A_bl and vddc1 B_bl) and to wordline (vddc_wl1_bl) of second BL bank (Bank 1, including Bank 1A and Bank 1 B).

When activated, power-gate transistors (T7, T8) supply core voltage (vddce) to bitcell power supplies 114 (vddc1_fbl, including vddc1C_fbl and vddc1D_fbl) and to wordline (vddc_wl1_fbl) of second FBL bank (Bank 1, including Bank 1C and Bank 1D). When deactivated, power-gate transistors (T7, T8) prevent supply of core voltage (vddce) to bitcell power supplies 114 (vddc1_fbl, including vddc1C_fbl and vddc1D_fbl) and to wordline (vddc_wl1 fbl) of second FBL bank (Bank 1, including Bank 1C and Bank 1D).

In various implementations, the power-up header circuitry 304 may also include peripheral support circuitry 318 having logic gates (L1, L2) and power-gate transistor (T9) that may be arranged and coupled together to provide peripheral supply voltage (vddpe) to peripheral circuitry 324 that may be disposed in the periphery of the multi-bank memory architecture 204. In some applications, as shown in FIG. 3, logic gate (L1) may receive the header control signals (hdr_ctrl_0, hdr_ctrl_1, hdr_ctrl_2, hdr_ctrl_3) as input signals and provide a first control signal (cs1) as an output signal to logic gate (L2) based on the input signals. Further, logic gate (L2) may receive the first control signal (cs1) as an input signal and provide a second control signal (cs2) as an output signal to the gate of power-gate transistor (T9) based on the input signal. When activated, the power-gate transistor (T9) is configured to supply the peripheral voltage (vddpe) to the peripheral power supply connection (vddp) of the peripheral circuitry 324. Also, when deactivated, the power-gate transistor (T9) is configured to prevent the supply of the peripheral voltage (vddpe) to the peripheral power supply connection (vddp) of the peripheral circuitry 324.

In some implementations, the bitlines include non-flexible bitlines (BL/NBL) and flexible bitlines (FBL/NFBL). In various applications, logic gate (L1) may refer to a NAND gate, and logic gate (L2) may refer to an inverter. However, various other configurations may be used to achieve similar results, behavior and/or characteristics. Also, in various applications, the power-gate transistors (T1, T2, T3, T4, T5, T6, T7, T8, T9) may refer to P-type field-effect transistors (PFET). However, various other configurations may be used (e.g., using N-type FETs) to achieve similar results, behavior and/or characteristics.

In various implementations, as described herein, the header circuitry (Hdr) has power-gate transistors for each bank that are activated by a header control signal so as to selectively power-up a selected bank during a wake-up mode of operation. The power-gate transistor for the selected bank is coupled between a supply voltage and the selected bank so as to power-up the selected bank during the wake-up mode of operation and also to allow transfer of the supply voltage to bitcells of the selected bank during the wake-up mode of operation. Also, as described herein, power-gate transistors for each unselected bank may be deactivated by the header control signal so as to selectively power-down the unselected banks during the wake-up mode of operation. The power-gate transistors for the unselected banks are coupled between the supply voltage and the unselected banks so as to power-down the unselected banks during the wake-up mode of operation and also to prevent transfer of the supply voltage to the bitcells of the unselected banks during the wake-up mode of operation.

Figure 4:
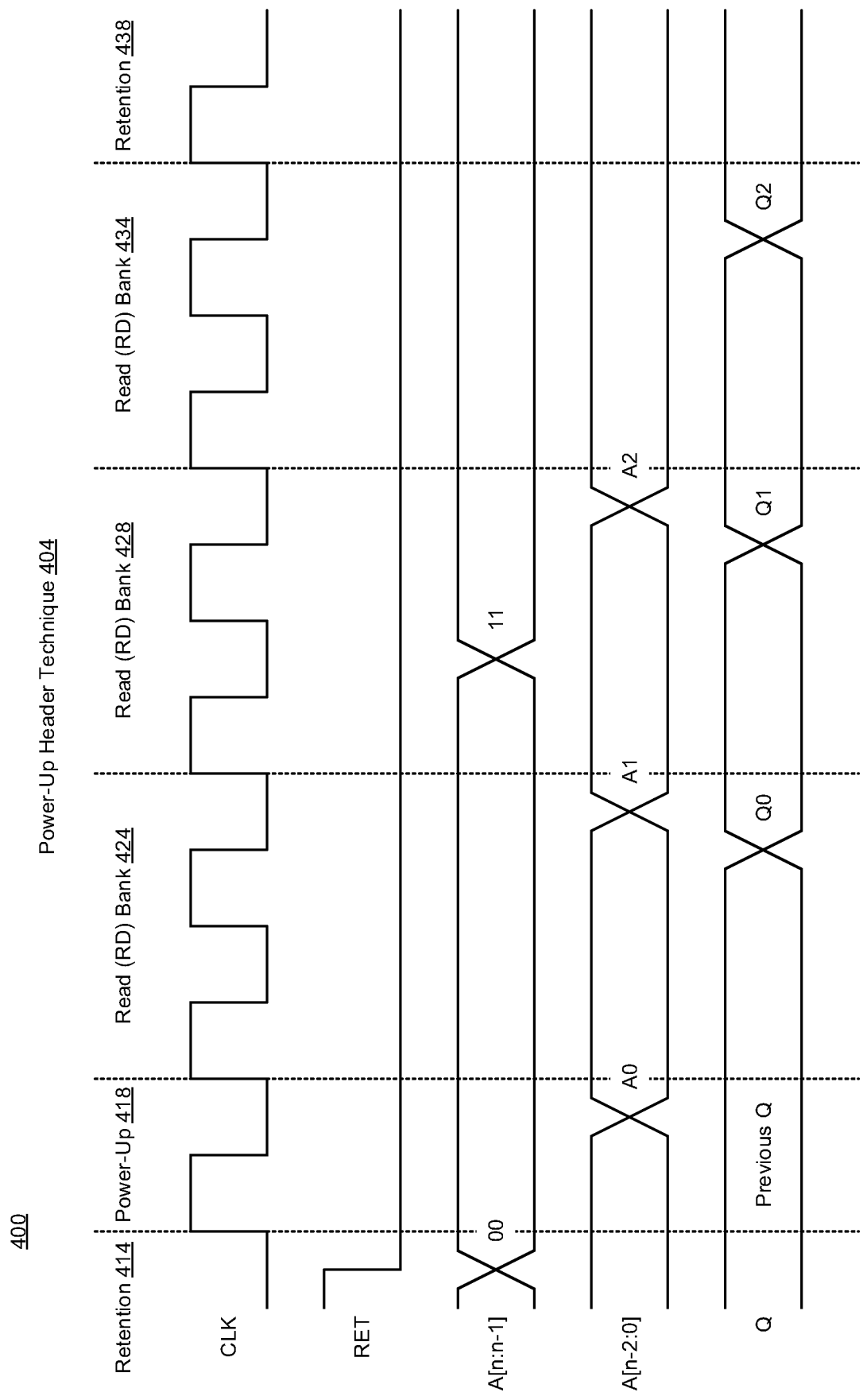
FIG. 4 illustrates a waveform diagram of using a power-up header technique in accordance with various implementations described herein.

FIG. 4 illustrates a waveform diagram 400 showing use of a power-up header technique 404 in accordance with various implementations described herein.

As shown in FIG. 4, the waveform diagram 400 shows the clock pulse signal (CLK) and the retention signal (RET). The waveforms are shown to transition between different stages 414, 418, 424, 428, 434, 438.

During the retention stage 414, the CLK signal is low, the RET signal transitions from high to low. Also, the logic state of the address signal A[n:n−1] toggles to the logic (00) state, the logic state of the address signal A[n−2:0] does not toggle, and the output signal (Q) remains as the previous Q state. In some instances, address signals A[n:n−1], A[n−2:0] may refer to either column addresses or row addresses for either bank BA[0] or bank BA[1].

During the power-up stage 418, the CLK signal is transitions from high to low and the RET signal is low. Also, the logic state of the address signal A[n:n−1] does not toggle and remains in logic (00) state, the logic state of the address signal A[n−2:0] toggles to logic (A0) state, and the output signal (Q) remains as the previous Q state.

During the Read (RD) Bank stage 424, the CLK signal double-cycles from high to low and the RET signal remains low. Also, the logic state of the address signal A[n:n−1] does not toggle and remains in logic (00) state, the logic state of the address signal A[n−2:0] toggles from the logic (A0) state to the logic (A1) state, and the output signal (Q) transitions from the previous Q state to the Q0 state.

During the Read (RD) Bank stage 428, the CLK signal double-cycles from high to low and the RET signal remains low. Also, the logic state of the address signal A[n:n−1] toggles to the logic (11) state, the logic state of the address signal A[n−2:0] toggles from the logic (A1) state to the logic (A2) state, and then the output signal (Q) transitions from the Q0 state to the Q1 state.

During the Read (RD) Bank stage 434, the CLK signal double-cycles from high to low and the RET signal remains low. Also, the logic state of the address signal A[n:n−1] toggles to the logic (11) state, the logic state of the address signal A[n−2:0] does not toggle and remains in the logic (A2) state, and then the output signal (Q) transitions from the Q1 state to the Q2 state.

During the retention stage 438, the CLK signal single-cycles from high to low and the RET signal remains low. Also, the logic state of the address signal A[n:n−1] does not toggle and remains in the logic (11) state, the logic state of the address signal A[n−2:0] does not toggle and remains in the logic (A2) state, and the output signal (Q) remains in the Q2 state.

In some applications, the RET signal transitions from high to low so as to trigger memory wake-up by activating the hdr_ctrl signal based on the bank address (BA). Also, the hdr_ctrl signal transition from low to high powers-up the accessed SRAM bank (thru vddc*), powers-up the WL Hdr of the accessed bank (thru vddc_wl*), and powers-up the SRAM peripheral logic (though vddp).

In some applications, the power-up header schemes and techniques described herein provide for fine grain automatic power management for effective and efficient use in system cache memories. For instance, the power-up header schemes and techniques provide for the single cycle fine-grained power-up of memory from the retention state upon access, wherein the memory Core supply (vddc*) powers-up from SRAM bitcell retention voltage. In some scenarios, only the SRAM bank being accessed is powered-up, which allows fine-grained power-gating control. Also, memory peripheral supply powers-up from previously complete power down, and only WL drivers of a specific bank (vddc_wl*) being accessed is powered-up. Also, the power-up header schemes automatically put memory to retention after access from the memory internal self-time.

In some applications, the power-up header schemes and techniques described herein provide the memory core supply to the SRAM bitcell retention voltage using diode drop and the memory peripheral supply (vddp) may be completely powered-down. Also, the power-up header schemes and techniques described herein utilize bank address bits (BA [1:0]) of the memory address in conjunction with the RET signal for selective wake-up and automatic power-down. If the next access is to the same memory, then there is no automatic power-down.

Figure 5:
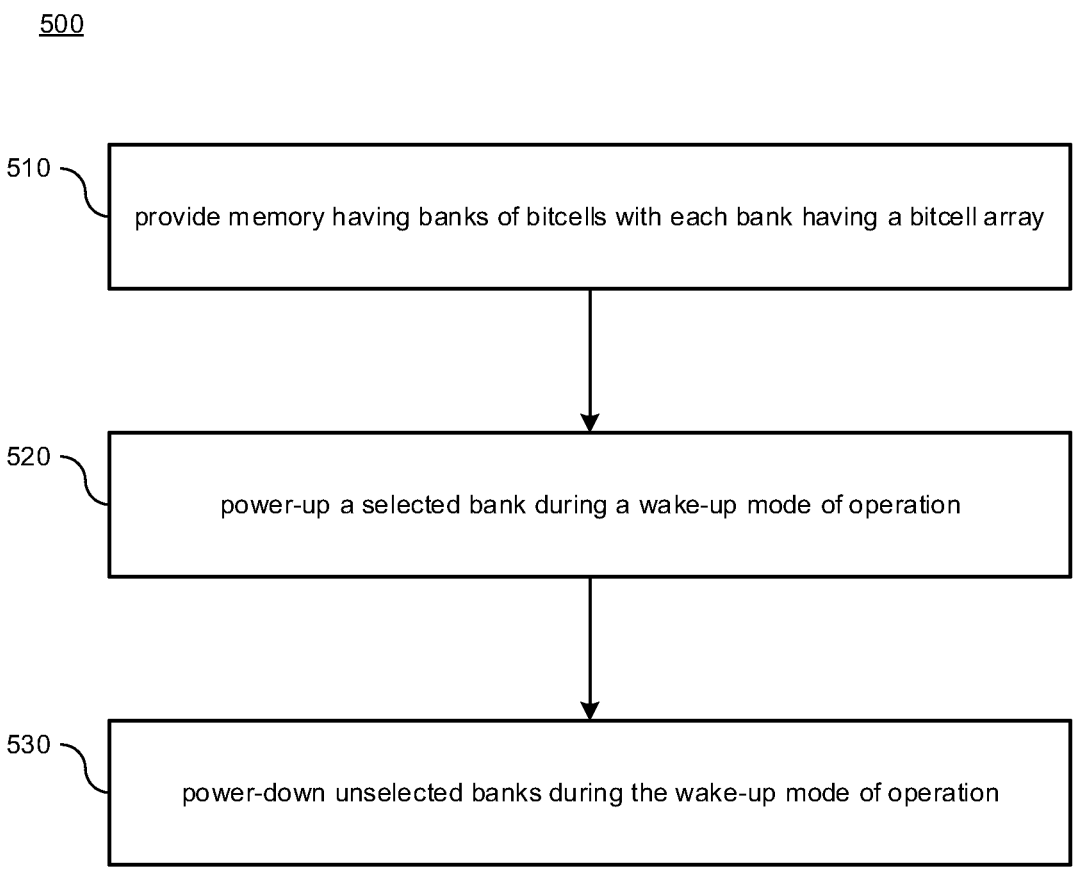
FIG. 5 illustrates a process flow diagram of a method for providing power-up header schemes and techniques for multi-bank memory applications in accordance with various implementations described herein.

FIG. 5 illustrates a process diagram of a method 500 for providing power-up header schemes and techniques for multi-bank memory applications in accordance with various implementations described herein.

It should be understood that even though the method 500 indicates a particular order of operation execution, in some cases, various particular portions of the operations may be executed in a different order, and on different systems. In other cases, additional operations and/or steps may be added to and/or omitted from method 500. Also, method 500 may be implemented in hardware and/or software. In some instances, if implemented in hardware, method 500 may be implemented with various components and/or circuitry, as described herein in reference to FIGS. 1-4. Also, if implemented in software, method 500 may be implemented as a program and/or a software instruction process configured for providing power-up header schemes and techniques for various multi-bank memory applications, as described herein. Also, if implemented in software, various instructions and/or operational programs associated with implementing method 500 may be stored in memory and/or a database. For instance, various types of computing devices having one or more processors and memory may be configured to perform method 500.

In various implementations, method 500 may refer to a method of designing, providing, building, fabricating and/or manufacturing memory structures as an integrated device that may involve use of various components and materials described herein. Also, the memory structures may be integrated with computing circuitry and components on a single chip, and further, the memory structures may be implemented in various embedded systems for various electronic, mobile, server and/or Internet-of-things (IoT) applications, including remote sensor nodes in various remote based memory applications.

At block 510, method 500 may provide memory having multiple banks of bitcells with each bank having a bitcell array. At block 520, method 500 may power-up at least one selected bank during a wake-up mode of operation. At block 530, method 500 may power-down unselected banks during the wake-up mode of operation. In some scenarios, only the selected bank of the memory is powered-up with the header circuitry during the wake-up mode of operation.

In some applications, the selected bank is activated by a power-gate transistor with a header control signal that powers-up the selected bank during the wake-up mode of operation. Also, in some instances, the power-gate transistor for the selected bank is coupled between supply voltage and the selected bank so as to power-up the selected bank during the wake-up mode of operation and allow transfer of the supply voltage to the bitcells of the selected bank during the wake-up mode of operation.

In some applications, the unselected banks may be deactivated by power-gate transistors with header control signals that power-down the unselected banks during the wake-up mode of operation. Also, in some instances, the power-gate transistors for the unselected banks may be coupled between supply voltage and the unselected banks so as to thereby power-down the unselected banks during the wake-up mode of operation and/or also to prevent transfer of the supply voltage to the bitcells of the unselected banks during the wake-up mode of operation.

Some advantages for power-up header schemes and techniques in multi-bank memory applications described herein may enable speculative power-up for the system cache to avoid memory access delay. Also, power-up header schemes and techniques may reduce static power in retention (RET) mode by not keeping the bitcell core and WL drivers turned ON. Also, power-up header schemes and techniques may reduce static power in the STANDBY mode by only keeping one memory bank+FBL powered up at any given time. Also, power-up header schemes and techniques use low wake-up dynamic energy and faster wake-up time due to lower capacitance of charging one bank+FBL block as compared to charging multiple (e.g., all four) memory banks+FBL block. Also, power-up header schemes and techniques does not utilize complicated daisy-chaining circuitry as in conventional systems for wake-up sequencing between banks.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having memory with banks of bitcells with each bank having a bitcell array. The device may have header circuitry that powers-up a selected bank and powers-down unselected banks during a wake-up mode of operation. In some instances, only the selected bank of the memory is powered-up with the header circuitry during the wake-up mode of operation.

Described herein are various implementations of a method that provides memory having banks of bitcells with each bank having a bitcell array. The method may power-up a selected bank during a wake-up mode of operation. The method may power-down unselected banks during the wake-up mode of operation. In some instances, only the selected bank of the memory is powered-up with the header circuitry during the wake-up mode of operation.

Described herein are various implementations of a device having memory with banks of bitcells with each bank having a bitcell array. The device may include header circuitry having a multiplexer that selects power-gate transistors coupled to the banks of bitcells during a wake-up mode of operation. The header circuitry may power-up a selected bank with at least one power-gate transistor during the wake-up mode of operation. The header circuitry may power-down unselected banks with one or more other power-gate transistors during the wake-up mode of operation.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
memory having banks of bitcells with each bank having a bitcell array; and
header circuitry that powers-up a selected bank and powers-down unselected banks during a wake-up mode of operation,
wherein only the selected bank of the memory is powered-up with the header circuitry during the wake-up mode of operation, and
wherein the header circuitry includes power-gate transistors for each bank that are configured to be activated by one or more header control signals so as to selectively power-up the selected bank during the wake-up mode of operation.

2. The device of claim 1, wherein the header circuitry only powers-up the selected bank during the wake-up mode of operation, and wherein the header circuitry only powers-down the unselected banks during the wake-up mode of operation.

3. The device of claim 1, wherein the power gate transistors comprise a power-gate transistor for the selected bank that is coupled between a supply voltage and the selected bank so as to power-up the selected bank during the wake-up mode of operation and allow transfer of the supply voltage to bitcells of the selected bank during the wake-up mode of operation.

4. The device of claim 1, wherein the power-gate transistors for each bank are further configured to be deactivated by the one or more header control signals so as to selectively power-down the unselected banks during the wake-up mode of operation.

5. The device of claim 4, wherein the power gate transistors comprise power-gate transistors for the unselected banks that are coupled between a supply voltage and the unselected banks so as to power-down the unselected banks during the wake-up mode of operation and prevent transfer of the supply voltage to bitcells of the unselected banks during the wake-up mode of operation.

6. The device of claim 1, wherein:
the header circuitry includes a multiplexer that selects the power-gate transistors, wherein the power-gate transistors are coupled to the banks of bitcells via bitcell power supplies;
the multiplexer powers-up the selected bank by activating respective power-gate transistors that are coupled to the selected bank during the wake-up mode of operation; and
the multiplexer powers-down the unselected banks by deactivating respective power-gate transistors that are coupled to the unselected banks during the wake-up mode of operation.

7. The device of claim 6, wherein:
the banks of bitcells include bitlines coupled to each bitcell in the bitcell array,
the bitlines include flexible bitlines and non-flexible bitlines, and
the multiplexer selects use of at least one of the flexible bitlines or the non-flexible bitlines for each bank with the power-gate transistors coupled to the banks of bitcells during the wake-up mode of operation.

8. The device of claim 6, wherein:
the multiplexer selects the power-gate transistors coupled to the banks of bitcells via the bitcell power supplies and wordline driver power supplies,
the multiplexer powers-up the selected bank by activating the respective power-gate transistors that are coupled to the selected bank via the bitcell power supplies and the wordline driver power supplies for the selected bank, and
the multiplexer powers-down the unselected banks by deactivating the respective power-gate transistors that are coupled to the unselected banks via the bitcell power supplies and the wordline driver power supplies for the unselected banks.

9. The device of claim 6, wherein:
the multiplexer is configured to generate the one or more header control signals to select the power-gate transistors based on one or more input signals, wherein the one or more input signals include a retention signal, a chip enable signal, a reset signal, a first bank select signal, and a second bank select signal, and
the multiplexer is configured to output the one or more header control signals to gates of the power-gate transistors for selective activation and deactivation of the power-gate transistors so as to power-up the selected bank and power-down the unselected banks during the wake-up mode of operation.

10. A method comprising:
providing memory having banks of bitcells with each bank having a bitcell array;
powering-up a selected bank during a wake-up mode of operation; and
powering-down unselected banks during the wake-up mode of operation,
wherein only the selected bank of the memory is powered-up with header circuitry during the wake-up mode of operation, and
wherein the header circuitry includes power-gate transistors for each bank that are configured to be activated by one or more header control signals so as to selectively power-up the selected bank during the wake-up mode of operation.

11. The method of claim 10, wherein:
the selected bank is activated by a respective power-gate transistor with a respective header control signal that powers-up the selected bank during the wake-up mode of operation, and
the respective power-gate transistor for the selected bank is coupled between supply voltage and the selected bank so as to power-up the selected bank during the wake-up mode of operation and allow transfer of the supply voltage to bitcells of the selected bank during the wake-up mode of operation.

12. The method of claim 10, wherein:
the unselected banks are deactivated by respective power-gate transistors with respective header control signals that power-down the unselected banks during the wake-up mode of operation, and
the respective power-gate transistors for the unselected banks are coupled between supply voltage and the unselected banks so as to power-down the unselected banks during the wake-up mode of operation and prevent transfer of the supply voltage to bitcells of the unselected banks during the wake-up mode of operation.

13. A device comprising:
memory having banks of bitcells with each bank having a bitcell array; and
header circuitry having a multiplexer that selects power-gate transistors coupled to the banks of bitcells during a wake-up mode of operation, wherein the header circuitry powers-up a selected bank with at least one power-gate transistor during the wake-up mode of operation, and wherein the header circuitry powers-down unselected banks with one or more other power-gate transistors during the wake-up mode of operation.

14. The device of claim 13, wherein:

the multiplexer selects the at least one power-gate transistor coupled to the selected bank of bitcells via bitcell power supplies, and the multiplexer powers-up the selected bank by activating the at least one power-gate transistor coupled to the selected bank during the wake-up mode of operation.

15. The device of claim 14, wherein:

the multiplexer selects the one or more other power-gate transistors coupled to the unselected banks of bitcells via the bitcell power supplies, and the multiplexer powers-down the unselected banks by deactivating the one or more other power-gate transistors coupled to the unselected banks during the wake-up mode of operation.

16. The device of claim 15, wherein:

the banks of bitcells include bitlines coupled to each bitcell in the bitcell array, the bitlines include flexible bitlines and non-flexible bitlines, and the multiplexer selects at least one of the flexible bitlines or the non-flexible bitlines for each bank with the power-gate transistors during the wake-up mode of operation.

17. The device of claim 14, wherein:

the multiplexer selects the at least one power-gate transistor coupled to the selected bank of bitcells via the bitcell power supplies and wordline driver power supplies, and the multiplexer powers-up the selected bank by activating the at least one power-gate transistor coupled to the bitcell power supplies and the wordline driver power supplies for the selected bank.

18. The device of claim 17, wherein:

the multiplexer selects the one or more other power-gate transistors coupled to the unselected banks of bitcells via the bitcell power supplies and the wordline driver power supplies, and the multiplexer powers-down unselected banks by deactivating the one or more other power-gate transistors that are coupled to the bitcell power supplies and the wordline driver power supplies for the unselected banks.

19. The device of claim 13, wherein:

the multiplexer generates a header control signal to select the power-gate transistors based on one or more input signals including a retention signal, a chip enable signal, a reset signal, a first bank select signal, and a second bank select signal, and the multiplexer outputs the header control signal to gates of the power-gate transistors for selective activation and deactivation of the power-gate transistors so as to power-up the selected bank and power-down the unselected banks during the wake-up mode of operation.

* * * * *